United States Patent
Haider et al.

(10) Patent No.: US 6,646,267 B1
(45) Date of Patent: Nov. 11, 2003

(54) METHOD FOR ELIMINATING FIRST, SECOND AND THIRD-ORDER AXIAL IMAGE DEFORMATIONS DURING CORRECTION OF THE THIRD-ORDER SPHERICAL ABERRATION IN ELECTRON OPTICAL SYSTEMS

(76) Inventors: Maximilian Haider, Pfarrgasse 29, D-69251 Gaiberg (DE); Stephan Uhlemann, Rathausstrasse 29, D 69126 Heidelberg (DE)

(*) Notice: Subject to any disclaimer, the term of this patent is extended or adjusted under 35 U.S.C. 154(b) by 0 days.

(21) Appl. No.: 09/508,239
(22) PCT Filed: Aug. 29, 1998
(86) PCT No.: PCT/DE98/02596
§ 371 (c)(1), (2), (4) Date: Apr. 24, 2000
(87) PCT Pub. No.: WO99/13490
PCT Pub. Date: Mar. 18, 1999

(30) Foreign Application Priority Data

Sep. 8, 1997 (DE) .......................................... 197 39 290

(51) Int. Cl.[7] .................................................. H01J 37/10
(52) U.S. Cl. ............ 250/396 R; 250/311; 250/396 ML; 250/398
(58) Field of Search ............................ 250/396 R, 311, 250/396 ML, 398

(56) References Cited

U.S. PATENT DOCUMENTS 5,084,622 A * 1/1992 Rose .................... 250/396 ML
5,838,011 A * 11/1998 Krijn et al. ............. 250/396 R
6,191,423 B1 * 2/2001 Krijn et al. ........... 250/396 ML

OTHER PUBLICATIONS

H. Rose, " Electron–Optical Corrector for Eliminating Third–Order Aberrations", Pub. Nol: US 2003/0034457 A1 of Feb. 20, 2003.*

* cited by examiner

*Primary Examiner*—John R. Lee
*Assistant Examiner*—Zia R. Hashmi
(74) *Attorney, Agent, or Firm*—Edwin D. Schindler

(57) ABSTRACT

The invention relates to a method for eliminating axial image deformations $\alpha^n$ in electron optical systems, where the extra-axial image deformation of the order n+m with the same behavior in $\alpha^n$, which thus has the form $\alpha^n \gamma^m$, is modified by shifting or tilting the beam path towards the optical axis until compensation of the axial image deformation has been achieved, whereby $\gamma$ describes the extra-axial image coordinate as a complex number in both sections. The invention also relates to an adjustment method for eliminating all first-, second- and third-order axial image deformations during correction of the third-order spherical aberration in electron optical systems with hexapoles.

13 Claims, 3 Drawing Sheets

Figure 1:
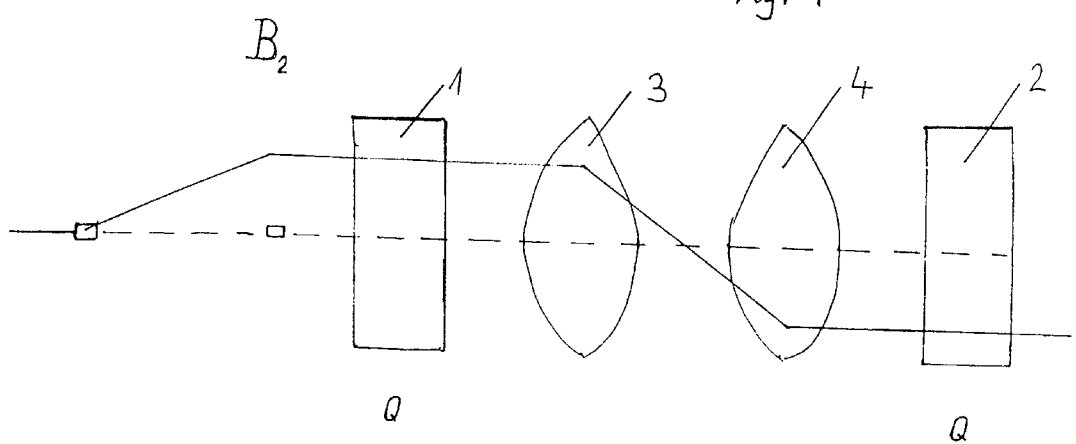

METHOD FOR ELIMINATING FIRST, SECOND AND THIRD-ORDER AXIAL IMAGE DEFORMATIONS DURING CORRECTION OF THE THIRD-ORDER SPHERICAL ABERRATION IN ELECTRON OPTICAL SYSTEMS

BACKGROUND OF THE INVENTION

1. Technical Field of the Invention

The invention relates to a method for eliminating first, second and third-order axial image deformations during correction of the third-order spherical aberration in electron optical systems with hexapoles.

2. Description of the Prior Art

It is generally known that the resolution of circular lenses in electron optical systems is limited by the third-order aberration (spherical aberration). In numerous fields of application, such as electron microscopy, the capacity of an electron optical system is defined by the resolution so that to improve such devices considerable efforts are made to eliminate the third order spherical aberration. One of the most promising solutions is the use of corrective means comprising noncircular lens systems, as for example described in EP 0451370, where a corrective means constituted by circular lenses and hexapoles, in the direction of the optical path, is disposed behind the lens system to be corrected, which is usually the objective lens of the electron microscope. In the case of the above mentioned corrective means, as with all other electron optical systems with correction of the third-order spherical aberration, in practice, adjustment errors occur that among other things impair the resolution, such errors relating primarily to first, second and third-order axial image deformations, the elimination of which is necessary in order to achieve the optimal resolution. The axial image deformations that occur as adjustment errors during correction of the third-order spherical aberration are as follows:

$C_1$ defocusing
$A_1$ first-order axial astigmatism with twofold symmetry
$B_2$ second-order axial coma
$A_2$ second-order astigmatism with threefold symmetry
$A_3$ third-order astigmatism with fourfold symmetry
$S_3$ third-order star aberration with twofold symmetry It holds for adjustment errors, which are also termed parasitic errors, that their value is of a small magnitude, and in case of ideal adjustment vanishes. The previous methods are characterised therein that the adjustment errors are eliminated successively for every mapping element of the electron optical system and sequentially in the direction of the beam propagation.

SUMMARY OF THE INVENTION

On the basis of this state-of-the-art, the invention has the object of creating an adjustment method with the aid of which the elimination of first, second and third-order axial image deformations can be effected.

As a solution, the following correction methods are explained, which put forward a theory by means of which individual second and third-order axial image deformations can be corrected; on the other hand, an adjustment method is specified for eliminating all first as well as second and third-order axial image deformations during correction to eliminate the third-order spherical aberration. The values $\overline{\alpha}$ and $\overline{\gamma}$ denote the respective complex conjugates. Subsequently, the correction of the individual image deformations are explained in greater detail in conjunction with the description of the adjustment method.

The first step as a prerequisite for eliminating the adjustment error is to determine the values of the respective aberration coefficients. A decisive difference in comparison to methods known in the state-of-the-art consists therein that the image deformations are measured behind the total system, as a rule comprising several lenses, exactly in the image plane so that the deformation is captured only in its entirety and mutual superposition. In order to determine the value of the respective image deformation coefficients, images are recorded with beam paths tilted against the optical axis, where the individual images have differences in the angle of inclination and azimuth of the illumination axis in relation to one another. Here the number of images is so great that the system of equations is at least determined. The evaluation is effected in the manner that a diffractogramm is produced, either in an analogue manner through diffraction or through a Fourier transform in mathematical treatments. From the diffraction patterns, the image deformations $C_1$, $A_1$ can be determined according to a known method. We refer to the contribution from F. Zemlin et al., Ultramicroscopy 3 (1978) 49. The further four complex adjustment aberrations and the real spherical aberration can be determined through a system of equations which is derived from the eikomal (see Zemlin aaO). With the five aforementioned image deformations, especially a system of equations, which comprises nine real equations, is to be derived and solved. In this way, the determination of the aberration coefficients to be eliminated is performed.

In order to eliminate the adjustment errors, steps are to be performed in the order described below.

Influencing and eliminating the defocusing and the first-order axial astigmatism with twofold symmetry are trivial; they are performed by changing the focussing (in case $C_1$) and through superposition of a quadrupolar field (in case $A_1$). After the first-order deformation is eliminated, the second-order deformations are to be corrected next, that is, the axial coma $B_2$ and the axial astigmatism $A_2$ with threefold symmetry, because only then a sufficiently exact determination of the third-order image deformation can be performed and thus its correction.

After the value has been determined in the prescribed way, the correction is performed as described below:

Second-order axial coma $B_2$:

The elimination can be effected by means of a so-called coma stigmator. To that end, in the corrective system, a pair of hexapoles are superpositioned respectively by a quadrupolar field of the same intensity, whereupon the product from the sign of the hexapole field and that of the associated quadrupolar field are antisymmetrical, that is, are opposed to each other. This condition ensures that no first-order astigmatism is generated. The intensity and orientation of these quadrupolar fields is determined by the measured coma.

In order to implement the quadrupolar fields various options are available. This may be achieved in practice by generating an additional quadrupolar field in the hexapoles of the corrective system.

A different possibility of creating the quadrupolar fields can consist therein of effecting a shifting of the optical axis parallel to the axis of the hexapole.

Second-order axial astigmatism with threefold symmetry $A_2$:

Here the correction is achieved through an additional hexapole field whose intensity and direction is likewise defined through the determined aberration coefficient. Implementation is attained through generation of such a hexapole field. A further possibility for generating a field consists in the virtual twisting of the hexapoles of the correction system against one another, whereupon a field with threefold symmetry is also generated. Implementation is achieved through the arrangement of a magnetic circular lens between the two hexapoles or the use of already existing ones. The advantage of this method consists therein that one saves the otherwise necessary path of use of a twelve-pole lens to generate a hexapole field of option size and alignment.

After first and second-order image deformations are now corrected, the values of the third-order image deformations can be determined in the way described above, namely the axial astigmatism $A_3$ with fourfold symmetry and the star aberration $S_3$ with twofold symmetry. The correction of these axial image deformations follows a common and general principle proposed for the first time by the invention. In order to correct the axial image deformation, the same extra-axial image deformation of higher order is used and by shifting or tilting the optical axis made effective until a compensation is achieved. Equality of the image deformation within the meaning of the invention means the same behaviour, that is, the same dependence on complex aperture angle $\alpha$ and its complex conjugate $\bar{\alpha}$. Thereby the power of the image coordinate $\gamma$ corresponds to the difference between the order of the extra-axial deformation used for correction and the order of the axial image deformation to be corrected.

In many applications, for instance, for reasons of controllability and accessibility or during correction of the value of smaller deformations, as occur during adjustment, the extra-axial deformation with linear dependency $\gamma$ is used. With an axial portion, one would have, for example, $\alpha^n$, whereby the associated extra-axial portion—assuming linearity—is then $\alpha^n \cdot \gamma$. With a third-order axial star deformation there is $\alpha^3$, so that the extra-axial and in $\gamma$ linear star deformation of the fourth-order used for correction is $\alpha^3 \gamma$. To correct the third-order axial astigmatism $\bar{\alpha}^3$ with fourfold symmetry, the fourth-order extra-axial astigmatism is used.

With the corresponding shifting of the optical axis, preferably in the region of the intermediate image, the extra-axial deformation can be influenced so that with corresponding adjustment a mutual compensation is achieved, i.e. elimination of the axial deformation portion, with the aid of the associated extra-axial image deformation within the meaning of the description above. In this way, the star aberration as well as the third-order astigmatism with fourfold symmetry can be eliminated.

The correction of the third-order deformation in the way described influences in principle the lower order deformations.

For this reason, upon termination of the correction procedure for the third-order image deformation, the resulting second and third order deformation must be measured and subsequently (again) corrected in the way described above. Through the use of suitable adjustment elements, it can be achieved that the first and second order are corrected without or only with a minor effect upon the third-order deformation. This is where the methods explained in claims 6–9 are used.

BRIEF DESCRIPTION OF THE DRAWING FIGURES

Further details, features and advantages of the invention can be taken from the following description part in which with the aid of the drawing the invention is explained in greater detail. It shows in diagrammatic view:

FIG. 1: the principle of the correction of the second-order axial coma $B_2$

Figure 2:
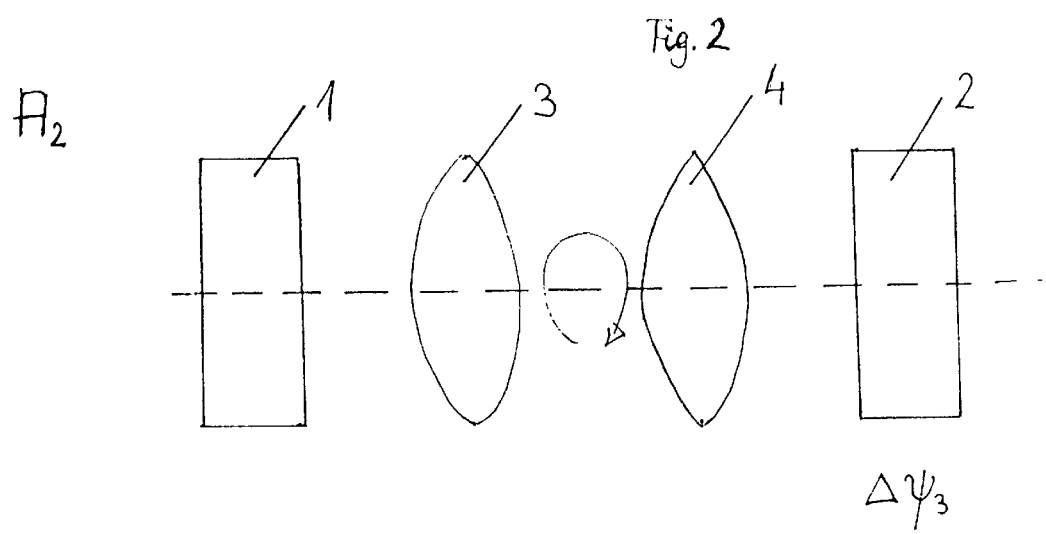
Figure 3:
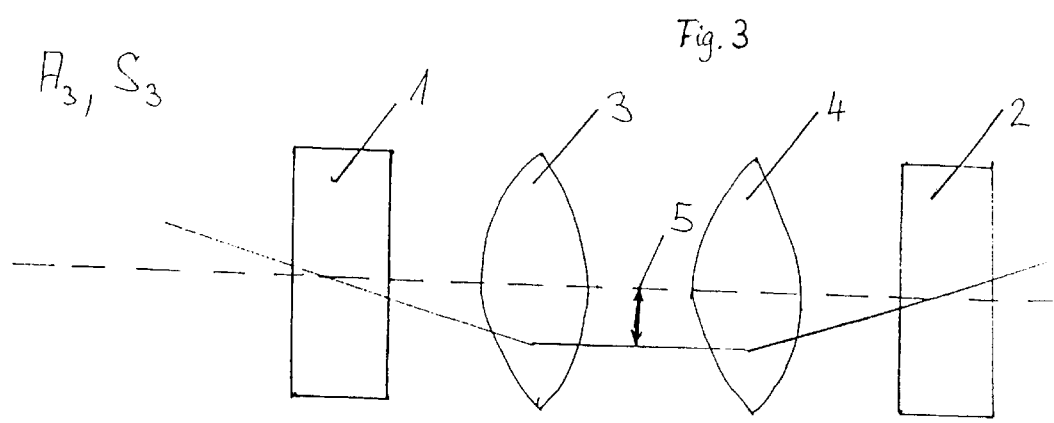

FIG. 2: the principle of correction of the second-order axial astigmatism $A_2$ with threefold symmetry, FIG. 3: the correction of the third-order axial astigmatism and the third-order star aberration.

DETAILED DESCRIPTION OF THE DRAWING AND PREFERRED EMBODIMENTS

In FIG. 1 the optical axis, which is represented by a dashed line, extends horizontally. Hexapoles 1 and 2 constrain outwards the system constituted by circular lenses 3 and 4. To correct the second-order axial coma $B_2$, as suggested by letter Q, a quadrupolar field is superpositioned in hexapoles 1 and 2, which act against each other. With the same sign for hexapole fields 1 and 2 and opposing signs for quadrupolar fields Q, an antisymmetry obtains, which avoids the generation of a first-order astigmatism. For compensation, the quadrupolar fields are adjusted in intensity and direction to the value of the measured coma. In addition to the direct generation of a quadrupolar field, such a field can be produced in an elegant manner in that the optical axis is shifted parallel to the axis of the hexapole by means of which in dependency on the displacement path a quadrupolar field is additionally generated.

FIG. 2 shows in a pictorial schematic the correction of the second-order axial astigmatism with threefold symmetry. To that end, a hexapole field is generated corresponding to the intensity and direction of the deformation value to be corrected. Between the two hexapoles 1 and 2 is disposed a magnetic circular lens system 3, 4 by means of which a Larmor twist of the beam path to be mapped is achieved and thus generates a virtual distortion of the two hexapoles 1, 2 in relation to each other. This also allows a hexapole field $\psi_3$ to be generated which can be adjusted in magnitude.

FIG. 3 also shows two hexapoles, with two circular lenses 3, 4 disposed therein, between which an intermediate image 5 is generated. By means of a displacement of the plane of the intermediate image, the same extra-axial image deformations of a higher order can be effected and used for compensation. As a rule, one uses for that purpose the next higher order extra-axial deformation, that is with linear $\gamma$ or $\bar{\gamma}$. To correct the $S_3$ order axial star aberration, therefore, the fourth-order extra-axial star aberration $\alpha^3 \gamma$ and with third-order axial astigmatism with fourfold symmetry, the fourth-order extra-axial astigmatism with fourfold symmetry is used. The corrections shown of individual axial image deformations are used among other things in adjustment methods to eliminate first, second and third-order axial image deformation during correction of the third-order spherical aberration in electron optical systems.

What is claimed is:

1. A method for eliminating an axial image deformation in electron optical systems with the axial image deformation being proportional to $\alpha^n$ or $\alpha^n \cdot \bar{\alpha}^{n-N}$, comprising the steps of:

measuring a beam angle of a beam path with respect to an an optical axis as a complex number by a magnitude and azimuth with n representing an order of the axial image deformation wherein an off-axis image deformation of an order n+m has the same behavior in $\alpha^n$, thereby having a form of $\alpha^n \gamma^m$ or $\alpha^N \bar{\alpha}^{n-N} \gamma^M \bar{\gamma}^{m-M}$; and, modifying via shifting or tilting the beam path with respect to the optical axis until a compensation of the axial image deformation has been achieved, wherein $\gamma$ describes image coordinates as a complex number.

2. The method for eliminating an axial image deformation in electron optical systems according to claim 1, wherein said off-axial image deformation is one order higher and linear in $\gamma^1$ or $\bar\gamma$.

3. The method for eliminating an axial image deformation in electron optical systems according to claim 2, further comprising the step of shifting the optical axis until an off-axial fourth-order astigmatism with four-fold symmetry, defined as $\alpha^{-3}\gamma$, completely compensates a third-order axial astigmatism with four-fold symmetry.

4. The method for eliminating an axial image deformation in electron optical systems according to claim 2, further comprising the step of shifting the beam path perpendicularly relative to the optical axis until a fourth-order off-axial star aberration, defined as either $\gamma\cdot\alpha^3$ or $\bar\gamma\cdot\alpha^3$, fully compensates a third-order star aberration, defined as $S_3(\alpha^3)$, with two-fold symmetry.

5. The method for eliminating an axial image deformation in electron optical systems according to claim 1, wherein said shifting or tilting the beam path is performed perpendicularly relative to the optical axis in a region of an intermediate image.

6. A method for correcting a second-order axial coma in electron optical systems with corrected spherical aberration using hexapoles, comprising the step of:

superpositioning a pair of hexapoles by a pair of quadrupolar fields with said pair of quadrupolar fields having equal magnitude, wherein a product from a sign of a hexapole field of said pair of hexapoles and that of a quadrupolar field of said pair of quadrupolar fields superpostioned on said hexapole field are opposed to one another.

7. A method for correcting a second-order axial coma in electron optical systems with corrected spherical aberration using hexapoles according to claim 6, further comprising the step of:

generating said quadrupolar field by shifting an optical parallel to an axis of said hexapole field.

8. A method for correcting a second-order axial astigmatism having three-fold symmetry in electron optical systems with corrected third-order spherical aberration using two hexapoles forming an initial hexapole field, comprising the step of:

superpositioning an additional hexapole field upon said initial hexapole field.

9. The method for correcting a second-order axial astigmatism having three-fold symmetry in electron optical systems according to claim 8, further comprising the step of:

generating said additional hexapole field by disposing a magnetic circular lens system between said two hexapoles for generating a virtual twist of said two hexapoles relative to one another.

10. A method for eliminating first-, second- and third-order axial aberrations during correction of a third-order spherical aberration in electron optical systems with hexapoles, comprising the steps of:

determining a value of a first-, second- and third-order axial image deformation coefficients behind an electron optical system in an image plane;

changing focussing and, through super-positioning of a quadrupolar field, a first-order axial astigmatism with two-fold symmetry being thereby corrected;

correcting a second-order axial coma and a second-order axial astigmatism with three-fold symmetry, the second-order axial coma being corrected via a method comprising the steps wherein two hexapoles are superimposed by a pair of quadrupolar fields of the same magnitude, in which products from a sign of a hexapole field from said two hexapoles and the sign from a respective said quadrupolar field superimposed on the hexapole field are opposed to each other, while the second-order axial astigmatism with three-fold symmetry is corrected via a method comprising the step of super-positioning an additional hexapole field;

eliminating a third-order astigmatism with four-fold symmetry, wherein the off-axial deformation is one order higher, comprising the step that an optical axis is shifted until the off-axial fourth-order astigmatism fully compensates the axial astigmatism with four-fold symmetry; and, eliminating a third-order star deformation via a method wherein the off-axial deformation is one order higher, comprising the step of shifting a beam path perpendicularly relative to the optical axis until the fourth-order, off-axial star aberration, fully compensates the third-order axial star aberration, whereby after correction is performed, the first- and second-order deformations arising therefrom are eliminated with adjustment elements that do not, or only slightly, affect the third order.

11. The method for eliminating first-, second- and third-order axial aberrations during correction of a third-order spherical aberration in electron optical systems with hexapoles according to claim 10, further comprising the step of:

generating said quadrupolar field by shifting the optical axis parallel to the axis of the hexapole field.

12. The method for eliminating first-, second- and third-order axial aberrations during correction of a third-order spherical aberration in electron optical systems with hexapoles according to claim 10, further comprising the step of:

generating the hexapole field by disposing a magnetic circular lens system between the two hexapoles for producing a virtual twist of the two hexapoles in relation to each other.

13. The method for eliminating first-, second- and third-order axial aberrations during correction of a third-order spherical aberration in electron optical systems with hexapoles according to claim 10, further comprising the step of:

shifting a beam path perpendicularly relative to the optical axis in a region of an intermediate image for eliminating the third-order star deformation.

* * * * *